United States Patent
Yang

(10) Patent No.: US 7,016,253 B2
(45) Date of Patent: Mar. 21, 2006

(54) FIXED-ADDRESS DIGITAL DATA ACCESS SYSTEM

(76) Inventor: Ching-His Yang, 3F,No.42, Lane61.Her Jiang St., Taipei (TW)

( * ) Notice: Subject to any disclaimer, the term of this patent is extended or adjusted under 35 U.S.C. 154(b) by 328 days.

(21) Appl. No.: 10/702,209

(22) Filed: Nov. 5, 2003

(65) Prior Publication Data
US 2005/0094437 A1    May 5, 2005

(51) Int. Cl.
*G11C 8/00*    (2006.01)

(52) U.S. Cl. .............................. 365/230.01; 365/230.03

(58) Field of Classification Search .......... 365/230.01, 365/230.03, 158, 63
See application file for complete search history.

(56) References Cited

U.S. PATENT DOCUMENTS 6,092,173 A * 7/2000 Sasaki et al. ................. 712/14

* cited by examiner

*Primary Examiner*—Son T. Dinh
(74) *Attorney, Agent, or Firm*—Leong C. Lei

(57) ABSTRACT

The present invention discloses a fixed-address digital data access system. The system in the present invention comprises a control module, a storage module and an access module wherein the control module is electrically coupled with the access module in order to control the access module; the access module reads and stores data electromagnetically with the storage module; and the storage module is removable. The present invention also discloses another fixed-address digital data access system wherein the access module and storage module are combined to form a single access module with storage media.

24 Claims, 3 Drawing Sheets

FIXED-ADDRESS DIGITAL DATA ACCESS SYSTEM

FIELD OF THE INVENTION

The present invention is related to a digital data access system and more particular, to a fixed-address digital data access system.

PRIOR ART

As the fast innovation of electronic technology, both hardware and software improves quickly and continuously. The digital data access devices nowadays fall into three main categories: the magnetic disk, the compact disk(CD) and the flash memory. The magnetic disk is a disk utilizing magnetic media for data storage wherein the magnetic media is media utilizing its magnetic property for data storage; the magnetic disk further falls into two categories: the fixed hard disk drive(HD) and the portable floppy disk drive. Common magnetic media includes magnetic disks, magnetic tapes . . . etc.; they are in most common use in modern computer systems for data storage. In addition, the compact disk is usually referred to as a small disk utilizing optical burning for digital data storage; the data storage structure of the compact disk is separated into two levels: the session level and the track level. The compact disk today is advantageous with its large data capacity and portability; however, it is still confined to some level in comparison with the hard disk drive considering data capacity, reading speed and reusability, which results in the fact that the compact disk still can not replace the hard disk drive. The floppy disk drive used for common personal computers is also advantageous with its portability, but it has even smaller data capacity and slower reading speed, therefore, as the demand amount for data exchange grows larger and larger, and as the flash memory becomes more and more popular, floppy disk drives are gradually eliminated through competition.

The hard disk drive is the most popular data access apparatus used in current computer systems for its large data capacity and fast reading speed. The hard disk drive comprises a plurality of magnetic disks on which data are stored magnetically. Each magnetic disk has two surfaces for data storage; each surface of the magnetic disk has a plurality of concentric circular areas called tracks; each track is separated into a plurality of sectors; a sector is the smallest unit for data access in a disk drive.

The cylinder, head and sector are the three major parts forming a hard disk drive: the cylinder is formed by a plurality of tracks at corresponding positions on different disks; the head is the number of disk surfaces; the sector is a common unit used for both the hard and floppy disk drives, it is the smallest unit for data access in a disk drive. A sector has the size of 512 bytes. Accordingly, the addressing or mapping work for a hard disk drive is the determination of the cylinder and head where the target sector locates, which is called the CHS(Cylinder Head Sector) mapping or CHS addressing method. However, earlier when the method was under development, the IDE interface, which is used for integrating the hard disk into the personal computer system, could only support 512 MB as the maximum capacity for single hard disk drive. Later, a new working mode for the addressing method, the Large mode, came out and solved the problem: the Large mode enables the hard disk to have a capacity up to 2 GB. A more popular addressing method for the hard disk drive is the Logical Block Addressing(LBA), which is able to support hard disks with capacity more than 8.4 GB. The logical block addressing method utilizes logical reflection for addressing specific sectors and is broadly used in some of the common interfaces devices in current personal computer systems like enhanced IDE interface devices and small computer system interface(SCSI) devices. Conventional addressing/mapping works for the hard disk drive are physical addressing/mapping, for example, we can track a sector to a detail of on which disk and track the sector is, and this kind of description for the sector location also represents the physical location of the sector in a hard disk drive in reality.

Accordingly, the compact disk is easy to carry but it still is not a choice for replacing the conventional hard disk drive for the unsolved limitations such as the data capacity and reading speed. The conventional hard disk drive though has its own disadvantages, especially that the conventional hard disk drive must be driven by an electrically-powered motor, which sets great limitations in sizing-down design work. Furthermore, the electrically-powered motor is even more disadvantageous for devices with power efficiency needs such as notebooks. Another example of size and power consumption related limitations on the application of the conventional hard disk drive set by the electrically-powered motor is the personal digital assistant (PDA). On the other hand the speed of the conventional hard disk drive is mostly determined by the running speed of the electrically-powered motor, thus to increase the speed of the hard disk drive, the running speed of the powered motor must be increased, too. However, the motor generates heat while running, thus the faster the motor runs, the more difficult the overall design for the whole system is, considering heat ventilation; which is unfavorable for developing high-speed hard disk drives. In addition, as the electrically-powered motor comprises several components, different modules are needed for manufacturing a single motor, which increases the manufacturing cost and makes the hard disk drive easily broken through shocks or collisions. There is still another disadvantage of the implement of the electrically-powered motor in a hard disk drive, which is the noise coming out when the motor is in action. Moreover, the faster the motor runs, the louder the noise is; which is again unfavorable for developing high speed hard drives. Accordingly, there are still lots of limitations on the conventional hard disk drive techniques that need to be overcome.

SUMMARY OF THE PRESENT INVENTION

In accordance with the present invention, a new digital data access system is provided that substantially overcomes the drawbacks of above problems mentioned from the system.

One object of the present invention is to provide a fixed-address digital data access system. The system in the present invention comprises a plurality of "data access areas"; each of the data access areas comprises a plurality of micro-data access devices or micro-data access circuits such that a whole set of fixed data addresses is formed in the provided digital data access system. In this manner, the present invention dispenses with the above-mentioned electrically-powered motor, which firstly overcomes the limitations on the sizing-down design work. Dispensing with the electrically-powered motor also reduces the power consumption and prevents the provided digital access data system from being easily broken through collisions or shocks. The present invention can also, via dispensing with the electrically-powered motor, produce less heat and noise in comparison with the conventional hard disk drive. Therefore, the present invention corresponds to economic effect and utilization in industry.

Accordingly, the present invention discloses a fixed-address digital data access system comprising a control module, an access module and a storage module. The control module is electrically coupled with the access module in order to control the access module; the access module reads and stores data electromagnetically with storage module; and the storage module is removable. The present invention also discloses a fixed-address digital data access system comprising a control module and an access module with storage media, wherein the control module is electrically coupled with the access module in order to control the access module; and the storage module is removable.

DESCRIPTION OF THE PREFERRED EMBODIMENT

Figure 1:
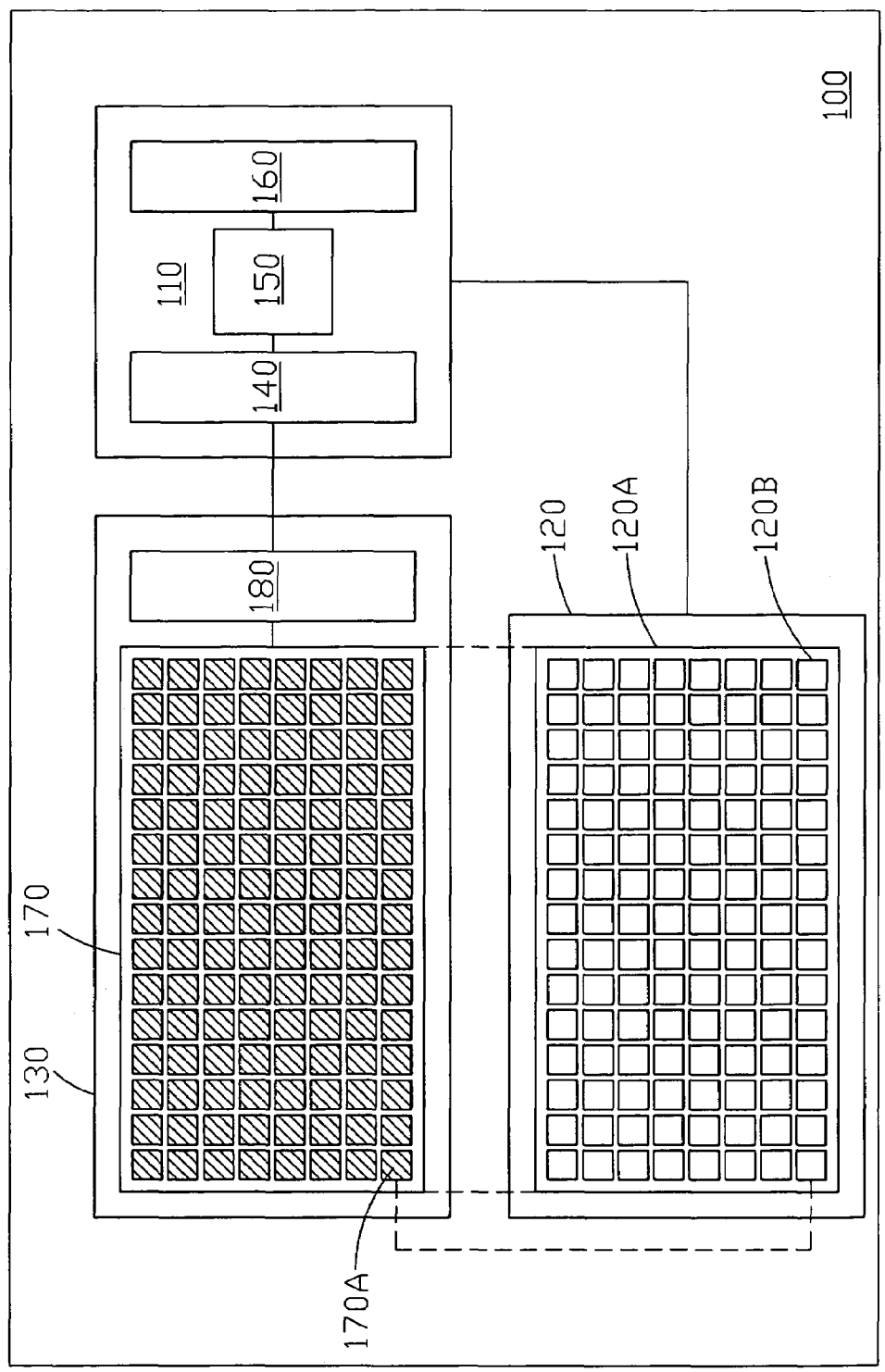
FIG. 1 is a block diagram illustrating the fixed-address digital data access system in accordance with one preferred embodiment in the present invention.

The present invention is related to a fixed-address digital data access system. The structure and working mechanism will now be described in greater detail to make the present invention more readily appreciated. Obviously, the present invention should not be limited in the details known to those skilled in the art, and well known devices will not be described herein to avoid unnecessary limitations. Preferred embodiments will now be described in greater detail. Nevertheless, it should be recognized that the present invention can be practiced in a wide range of other embodiments besides those explicitly described, and the scope of the present invention is expressly not limited except as specified in the accompany claims Reference is now made to FIG. 1, in one embodiment of the present invention, a fixed-address digital data access system 100 is provided. The system 100 comprises a control module 110, a storage module 120 and an access module 130 wherein the control module 110 is electrically coupled with the access module 130 in order to control the access module 130; and the storage module 120 is removable. The control module 110 further comprises a connection interface 140, a control sub-circuitry 150 and at least one transmission interface 160, wherein the control sub-circuitry 150 is electrically coupled with the connection interface 140 and the at least one transmission interface 160, respectively; the system 100 communicates and exchange signals with external electronic devices via the transmission interface 160. The access module 130 further comprises an electromagnetic-inductive sub-circuitry 180 and an electromagnetic-inductive area 170 with a plurality of micro-data access devices 170A. The electromagnetic-inductive area 170 is electrically coupled with the electromagnetic-inductive sub-circuitry 180 and each of the micro-data access devices 170A is specifically located in the electromagnetic-inductive area 170.

Referring to FIG. 1, in this embodiment, the storage module 120 further comprises at least one electromagnetic-inductive medium 120A wherein the at least one electromagnetic-inductive medium 120A of the storage module 120 is corresponding to the electromagnetic-inductive area 170 of the access module 130 with respect to the data access address. The at least one electromagnetic-inductive medium 120A has a plurality of digital data access areas 120B located therein according to a pre-determined order such that the plurality of digital data access areas 120B are corresponding to the plurality of micro-data access devices 170A with respect to the data access address, and that each of the micro-data access devices 170A is able to read and store digital data with corresponding digital data access area 120B thereof. When inserted in the fixed-address digital data access system 100, the storage module 120 receives power from the fixed-address digital data access system 100 such that the power needed by the access module 130 is reduced. Further, the storage module 120 is electrically coupled with the control module 110 whereby the control sub-circuitry 150 is able to control a specifically located micro-data access device 170A and the corresponding digital data access area 120B thereof at the same time. A conductive material is further used to make a part of the at least one electromagnetic-inductive medium 120A to strengthen the electromagnetic effect. The fixed-address digital data access system 100 works as follows: Initially, the storage module 120 is inserted into the fixed-address digital data access system 100. When digital data at a specific data access address are requested, an external electronic device transmits an access signal to the control module 110 via the at least one transmission interface 160 to read the data needed. Then, the control sub-circuitry 150 of the control module 110 transmits a control signal to the electromagnetic-inductive sub-circuitry 180 via the connection interface 140 to control the micro-data access device 170A and the corresponding electromagnetic medium 120A thereof for reading the requested digital data from the digital data access area 120B at the target data access address.

Figure 2:
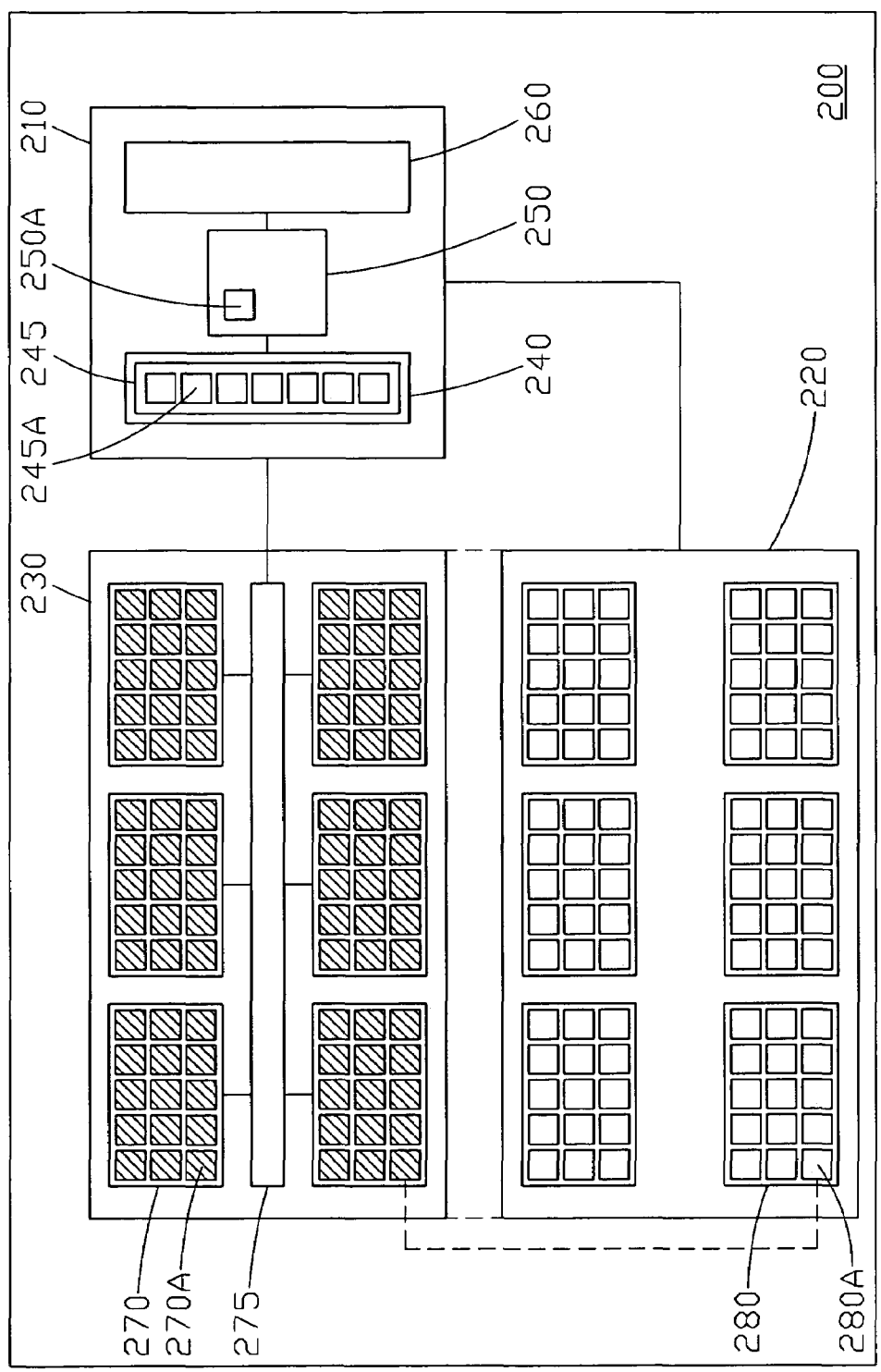
FIG. 2 is a block diagram illustrating the fixed-address digital data access system in accordance with another preferred embodiment in the present invention.

Reference is now made to FIG. 2, in another embodiment of the present invention, a fixed-address digital data access system 200 is provided. The system 200 comprises a control module 210, a storage module 220 and an access module 230 wherein the control module 210 is electrically coupled with the access module 230 in order to control the access module 230; and the storage module 220 is removable. The control module 210 further comprises a connection interface 240, a control sub-circuitry 250 and at least one transmission interface 260 wherein the control sub-circuitry 250 is electrically coupled with the connection interface 240 and the at least one transmission interface 260; the system 200 communicates and exchanges signals with external electronic devices via the transmission interface 260. The control sub-circuitry 250 further comprises at least one data access address table 250A for storing information about a plurality of data access addresses; the connection interface 240 comprises a switch sub-circuitry 245 for controlling a plurality of electromagnetic-inductive areas 270; the switch sub-circuitry 245 has a plurality of data access address switches 245A wherein each of the data access address switches 245A is corresponding to a single item in the data access address table 250A such that the control sub-circuitry 250 is able to control the plurality of data access address switches 245A of the switch sub-circuitry 245. The access module 230 further comprises an electromagnetic-inductive sub-circuitry 275 which has a plurality of electromagnetic-inductive areas 270; a plurality of micro-data access devices 270A are set in the electromagnetic-inductive area 270; and each micro-data access device 270A is set according to the data access address table 250A. The plurality of micro-data access devices 270A are electrically coupled with the plurality of data access address switches 245A in the switch sub-circuitry 245 via the electromagnetic-inductive sub-circuitry 275.

Referring to FIG. 2, in this embodiment, the storage module 220 further comprises a plurality of electromagnetic-inductive media 280 wherein the plurality of electromagnetic-inductive media 280 are corresponding to the plurality of electromagnetic-inductive areas 270 of the access module 230 with respect to the data access address for electromagnetic data access. Each of the electromagnetic-inductive media 280 has a plurality of digital data access areas 280A located therein according to the data access address table 250A, in order to enable the plurality of digital data access areas 280A to correspond to the plurality of micro-data access devices 270A with respect to the data access address. When inserted in the fixed-address digital data access system 200, the storage module 220 receives power from the fixed-address digital data access system 200 such that the power needed by the access module 230 is reduced. Further, the storage module 220 is electrically coupled with the control module 210 whereby the control sub-circuitry 250 is able to control a specifically located micro-data access device 270A and the corresponding digital data access area 280A thereof at the same time. A conductive material is further used to make a part of each electromagnetic-inductive medium 280 to strengthen the electromagnetic effect. The fixed-address digital data access system 200 works as follows: Initially, the storage module 220 is inserted into the fixed-address digital data access system 200. When digital data at a specific data access address are requested, an external electronic device transmits an access signal to the control module 210 via the at least one transmission interface 260 to read the data needed. Then, the control sub-circuitry 250 of the control module 210 transmits a control signal to the switch sub-circuitry 245 of the connection interface 240 according to the data access address table 250A to turn on an data access address switch 245A specifically located. After that, the control signal is further transmitted to the electromagnetic-inductive sub-circuitry 275 of the access module 230 via the data access address switch 245A to control a specifically located micro-data access device 270A of the electromagnetic-inductive area 270 and the corresponding electromagnetic medium 280 thereof of the storage module 220 for reading the requested digital data from the digital data access area 280A at the target data access address.

Figure 3:
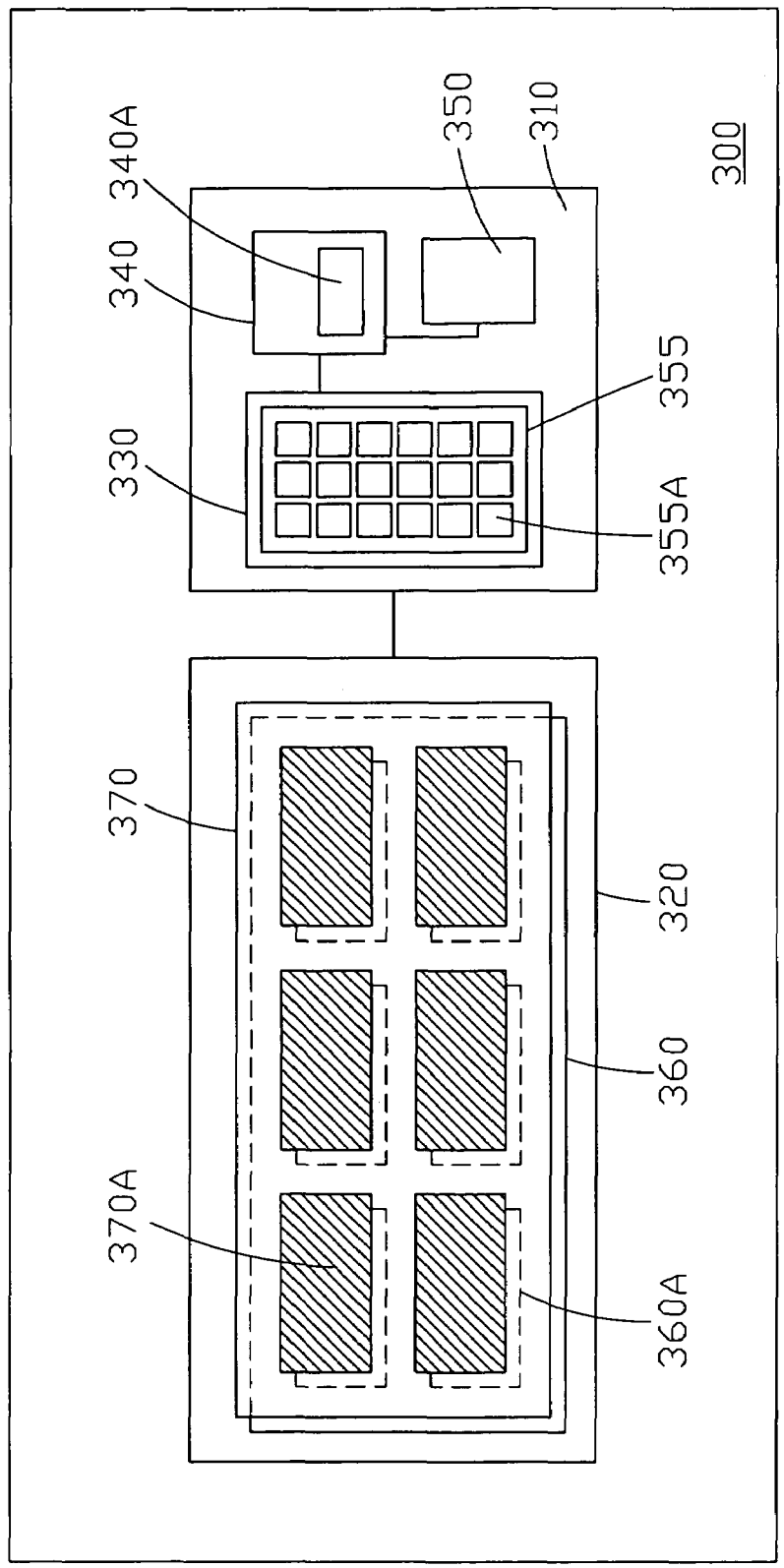
FIG. 3 is a block diagram illustrating the fixed-address digital data access system in accordance with still another preferred embodiment in the present invention.

Reference is now made to FIG. 3, in still another embodiment of the present invention, a fixed-address digital data access system 300 is provided. The system 300 comprises a control module 310 and an access module 320 wherein the control module 310 is electrically coupled with the access module 320 in order to control the access module 320; and the access module 320 is removable. The control module 310 further comprises a connection interface 330, a control sub-circuitry 340 and at least one transmission interface 350, wherein the control sub-circuitry 340 is electrically coupled with the connection interface 330 and the at least one transmission interface 350, respectively; the system 300 communicates and exchanges signals with external electronic devices via the at least one transmission interface 350; the access module 320 is electrically coupled with the control module 310 via the connection interface 330. The control sub-circuitry 340 further comprises at least one data access address table 340A for storing information about a plurality of data access addresses; the connection interface 330 comprises a switch sub-circuitry 355 for controlling a plurality of electromagnetic-inductive circuitry 370A. The switch sub-circuitry 355 has a plurality of data access address switches 355A wherein each of the data access address switches 355A is corresponding to a single item in the data access address table 340A such that the control sub-circuitry 340 is able to control the plurality of data access address switches 355A of the switch sub-circuitry 355. The access module 320 comprises at least one storage medium layer 360 and an electromagnetic-inductive sub-circuitry 370 having a plurality of electromagnetic-inductive circuitry 370A, wherein the at least one storage medium layer 360 is set in the plurality of electromagnetic-inductive circuitry 370A of the electromagnetic-inductive sub-circuitry 370 and the electromagnetic-inductive sub-circuitry 370 is electrically coupled with the switch sub-circuitry 355 such that each of the data access address switches 355A can also be electrically coupled with each of the electromagnetic-inductive circuitry 370A according the data access address table 340A.

Referring to FIG. 3, in this embodiment, the at least one storage medium layer 360 further comprises a plurality of data access areas 360A wherein the plurality of data access areas 360A are set in the plurality of electromagnetic-inductive circuitry 370A according to the data access address table 340A for electromagnetic digital data access. The control sub-circuitry 340 is able to control a specifically located electromagnetic-inductive circuitry 370A and the corresponding digital data access area 360A thereof at the same time via the connection interface 330. A conductive material is further used to make a part of the at least one storage medium layer 360 to strengthen the electromagnetic effect. The fixed-address digital data access system 300 works as follows: Initially, the access module 320 is inserted into the fixed-address digital data access system 300. When digital data at a specific access address are requested, an external electronic device transmits an access signal to the control module 310 via the at least one transmission interface 350 to read the data needed. Then, the control sub-circuitry 340 of the control module 310 transmits a control signal to the switch sub-circuitry 355 of the connection interface 330 according to the data access address table 340A to turn on a specific data access address switch 355A. After that, the control signal is further transmitted to the electromagnetic-inductive sub-circuitry 370 of the access module 320 via the data access address switch 355A to control a specific micro-data access device 370A and the corresponding digital data access area 360A thereof of the at least one storage medium layer 360 for reading the requested digital data from the digital data access area 360A at the target address.

Accordingly, in the preferred embodiments of the present invention, each of the plurality of the micro-data access devices or access circuitry is respectively set at specific addresses in the digital data access systems provided, which is totally different from the conventional hard disk drive data access mechanism. The present invention can be applied to any other digital data access system, and the mechanism for data access mentioned above has not been disclosed or developed in any digital data access system.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. A fixed-address digital data access system, comprising:
   a control module with a control sub-circuitry;
   an access module with an electromagnetic-inductive sub-circuitry, said access module is electrically coupled with said control module for said control module to control said access module, and said access module has a plurality of micro-data access devices which are electrically coupled with said control module via said electromagnetic-inductive sub-circuitry and are specifically located in said access module; and
   a storage module with at least one electromagnetic-inductive medium, said at least one electromagnetic-inductive medium corresponds to said electromagnetic-inductive sub-circuitry of said access module with respect to the data access address for electromagnetic data access.

2. The fixed-address digital data access system according to claim 1, wherein said control module further comprises a connection interface electrically coupled with said control sub-circuitry.

3. The fixed-address digital data access system according to claim 1, wherein said control module further comprises a transmission interface electrically coupled with said control sub-circuitry to enable said fixed-address digital data access system to communicate and exchange signals with an external electronic device.

4. The fixed-address digital data access system according to claim 1, wherein a conductive material is further used to make a part of said at least one electromagnetic-inductive medium to strengthen the electromagnetic effect.

5. The fixed-address digital data access system according to claim 1, wherein said at least one electromagnetic-inductive medium further comprises a plurality of digital data storage areas specifically located in said at least one electromagnetic-inductive medium for being corresponding to said plurality of micro-data access devices of said electromagnetic sub-circuitry with respect to data access address.

6. The fixed-address digital data access system according to claim 1, wherein said storage module is able to receive power from said fixed-address digital data access system.

7. The fixed-address digital data access system according to claim 6, wherein said storage module is electrically coupled with said control module to receive power from said fixed-address digital data access system and to enable said control sub-circuitry to control a specific said micro-data access device and the corresponding at least one electromagnetic-inductive medium thereof.

8. A fixed-address digital data access system, comprising:
   a control module with a control sub-circuitry, said control sub-circuitry has at least one data access address table for storing information about a plurality of data access addresses;
   an access module with a plurality of electromagnetic-inductive areas and one electromagnetic-inductive sub-circuitry, said access module is electrically coupled with sad control module for said control module to control said access module, and said electromagnetic-inductive sub-circuitry is electrically coupled with said plurality of electromagnetic-inductive areas wherein each of said plurality of electromagnetic-inductive areas has a plurality of micro-data access devices and said plurality of micro-data access devices are electrically coupled with said control module via said electromagnetic-inductive sub-circuitry and each of said plurality of micro-data access devices is set in said plurality of electromagnetic-inductive areas according to said at least one data access address table; and
   a storage module with a plurality of electromagnetic-inductive medium wherein said plurality of electromagnetic-inductive medium correspond to said plurality of electromagnetic-inductive areas with respect to the data access address for electromagnetic data access.

9. The fixed-address digital data access system according to claim 8, wherein said control module further comprises a connection interface electrically coupled with said control sub-circuitry and said access module respectively.

10. The fixed-address digital data access system according to claim 9, wherein said connection interface has a switch sub-circuitry for controlling said plurality of electromagnetic-inductive areas.

11. The fixed-address digital data access system according to claim 10, wherein said switch sub-circuitry has a plurality of data access address switches, each of said plurality of data access address switches corresponds to each item in said data access address table wherein said control sub-circuitry can control said plurality of data access address switches of said switch sub-circuitry according to said data access address table.

12. The fixed-address digital data access system according to claim 11, wherein said plurality of micro-data access devices are electrically coupled with said plurality of data access address switches via said electromagnetic-inductive sub-circuitry.

13. The fixed-address digital data access system according to claim 8, wherein said control module further comprises a transmission interface electrically coupled with said control sub-circuitry for said fixed-address digital data access system to communicate and exchange signals with an external electronic device.

14. The fixed-address digital data access system according to claim 8, wherein a conductive material is further used to make a part of said plurality of electromagnetic-inductive media to strengthen the electromagnetic effect.

15. The fixed-address digital data access system according to claim 8, wherein each of said electromagnetic-inductive media has a plurality of digital data access areas, said plurality of digital data access areas are set in said plurality of electromagnetic-inductive media according to the items in said data access address table in order to be corresponding to said plurality of micro-data access devices in said plurality of electromagnetic areas.

16. The fixed-address digital data access system according to claim 8, wherein said storage module is able to receive power from said fixed-address digital data access system.

17. The fixed-address digital data access system according to claim 16, wherein said storage module is electrically coupled with said control module to receive power from said fixed-address digital data access system and to enable said control sub-circuitry to control said micro-data access devices located at specific address and the corresponding said at least one electromagnetic-inductive medium thereof at the same time.

18. A fixed-address digital data access system, comprising:
   a control module with a control sub-circuitry wherein said control sub-circuitry has at least one data access address table for storing information about a plurality of data access addresses; and an access module with at least one storage medium layer and an electromagnetic-inductive sub-circuitry, said access module is electrically coupled with said control module for said control module to control said access module, and said electromagnetic-inductive sub-circuitry has a plurality of electromagnetic-inductive circuitry with said at least storage medium layer therein.

19. The fixed-address digital data access system according to claim 18, wherein said control module further comprises a connection interface electrically coupled with said control sub-circuitry and said electromagnetic-inductive sub-circuitry respectively.

20. The fixed-address digital data access system according to claim 19, wherein said connection interface has a switch sub-circuitry for controlling said plurality of electromagnetic-inductive circuitry.

21. The fixed-address digital data access system according to claim 20, wherein said switch sub-circuitry has a plurality of data access address switches.

22. The fixed-address digital data access system according to claim 21, wherein said electromagnetic-inductive sub-circuitry is electrically coupled with said switch sub-circuitry for each of said data access address switches to be electrically coupled with each said electromagnetic-inductive circuitry according to said data access address table.

23. The fixed-address digital data access system according to claim 18, wherein said at least one storage medium layer further comprises a plurality of digital data access areas, said plurality of digital data access areas are set on said plurality of electromagnetic-inductive circuitry for electromagnetic data access.

24. The fixed-address digital data access system according to claim 18, wherein a conductive material is further used to make a part of said at least one storage medium layer to strengthen the electromagnetic effect.

* * * * *

UNITED STATES PATENT AND TRADEMARK OFFICE
CERTIFICATE OF CORRECTION

| | |
|---|---|
| PATENT NO. | : 7,016,253 B2 |
| APPLICATION NO. | : 10/702209 |
| DATED | : March 21, 2006 |
| INVENTOR(S) | : Ching-Hsi Yang |

It is certified that error appears in the above-identified patent and that said Letters Patent is hereby corrected as shown below:

<u>Title page,</u>
Item [76], Inventors, name should read -- Ching-Hsi Yang --.

Signed and Sealed this

Twentieth Day of June, 2006

JON W. DUDAS
*Director of the United States Patent and Trademark Office*